(12) United States Patent
Yang et al.

(10) Patent No.: US 7,928,430 B2
(45) Date of Patent: Apr. 19, 2011

(54) MONONUCLEAR STAR-BRANCHED POLYMER DIELECTRIC MATERIAL AND ORGANIC THIN FILM TRANSISTOR

(75) Inventors: Feng-Yu Yang, Hsinchu County (TW);
Mee-Yu Hsu, Kaohsiung (TW);
Shu-Hua Chan, Miaoli County (TW);
Yu-Rung Peng, Taoyuan County (TW);
Yu-Shen Mai, Kaohsiung (TW);
Wei-Yang Chou, Kaohsiung County (TW)

(73) Assignee: Industrial Technology Research Institute, Hsinchu (TW)

( * ) Notice: Subject to any disclaimer, the term of this patent is extended or adjusted under 35 U.S.C. 154(b) by 371 days.

(21) Appl. No.: 11/672,523

(22) Filed: Feb. 8, 2007

(65) Prior Publication Data

US 2008/0121871 A1     May 29, 2008

(30) Foreign Application Priority Data

Nov. 23, 2006    (TW) ............................... 95143319 A

(51) Int. Cl.
*H01L 51/05* (2006.01)
*H01L 51/30* (2006.01)
*C08G 63/00* (2006.01)

(52) U.S. Cl. ........... 257/40; 257/E51.006; 257/E51.025; 525/326.1; 525/333.3

(58) Field of Classification Search .......... 257/40, 257/E51.006, E51.025, 4, 27, E51.002, E51.005, 257/E51.007; 525/191, 241, 55, 326.1, 333.3, 525/534, 328.9, 374
See application file for complete search history.

(56) References Cited

U.S. PATENT DOCUMENTS

| | | | |
|---|---|---|---|
| 6,414,101 B1 | 7/2002 | Watanabe et al. | |
| 6,451,502 B1 | 9/2002 | Ray et al. | |
| 6,713,564 B1 * | 3/2004 | Nobuhara et al. | 525/328.9 |

OTHER PUBLICATIONS

Veres, J. et al Chemistry of Materials vol. 16 (2004) pp. 4543-4555.*
Ghani, M. et al, Canadian Journal of Chemistry vol. 82 (2004) pp. 1403-1412.*
Wang, X. et al European Polymer Journal vol. 41 (2005) pp. 933-940.*

* cited by examiner

*Primary Examiner* — Irina S Zemel
*Assistant Examiner* — Jeffrey Lenihan
(74) *Attorney, Agent, or Firm* — Jianq Chyun IP Office

(57) ABSTRACT

A mononuclear star-branched polymer dielectric material having a repeat unit of the formula (I):

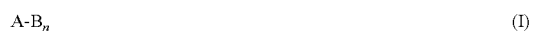

wherein, A represents a multifunctional center having a functionality and a functional group with "n" arms; n is an integer greater than 2. B represents a hydrolyzed or partially hydrolyzed compound of the formula (II):

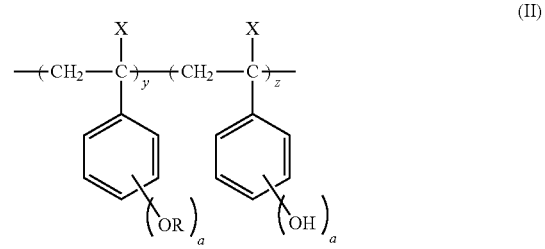

wherein, X represents H or $CH_3$; R represents H, alkyl or is selected from a group consisting of acetoxyl, t-butyl, t-butyldimethyl silyl, acid labile groups and acid stable groups; "a" is an integer from 1 to 5; y and z are molar ratio and are the numbers satisfying $y+z=1$, $0<y\leq 1$ and $0\leq z<1$.

5 Claims, 6 Drawing Sheets

MONONUCLEAR STAR-BRANCHED POLYMER DIELECTRIC MATERIAL AND ORGANIC THIN FILM TRANSISTOR

CROSS-REFERENCE TO RELATED APPLICATION

This application claims the priority benefit of Taiwan application serial no. 95143319, filed on Nov. 23, 2006. All disclosure of the Taiwan application is incorporated herein by reference.

BACKGROUND OF THE INVENTION

1. Field of the Invention

The present invention relates to polymer dielectric layer material of an organic thin film transistor (OTFT), and more particularly to a mononuclear star-branched polymer dielectric layer material and an OTFT having the polymer dielectric layer material.

2. Description of Related Art

Organic thin film transistor (OTFT) technology can be applied to fabricate large-screen display products and has the advantages of low processing temperature and low production cost. As a result, many research institutes/entities are working on developing materials and processing techniques related to the fabrication of organic thin film transistor. The most promising and competitive organic semiconductor material in this field includes pentacene or regio-regular poly-thiophene.

However, most current researches on the organic thin film transistor is still built upon using $SiO_2$ as the gate dielectric layer. Yet, the trend in the development of the organic thin film transistor should most probably be heading toward the use of complete plastic material so that large area and low cost fabricating method such as printing could be used. Thus, research into other organic polymer materials that can replace the conventional $SiO_2$-based gate dielectric layer is urgent and worth the effort.

Furthermore, the working area of the organic thin film transistor device is located at the interface between the semiconductor and the dielectric layer. Consequently, the properties at the interface would largely determine the highs and lows of device performance. Additionally, mechanical properties, thermal properties and chemical stability are some of the main factors determining the commercialization into end products.

SUMMARY OF THE INVENTION

Accordingly, the present invention is directed to a mononuclear star-branched polymer dielectric material that can effectively suppress current leakage.

Additionally, the present invention is directed to an organic thin film transistor for enhancing device performance and improving thermal stability.

As embodied and broadly described herein, the present invention provides a mononuclear star-branched polymer dielectric material having a repeated unit of the formula (I):

$A\text{-}B_n$  (I)

wherein, A represents a multifunctional center having a functionality and a functional group with "n" arms; n is an integer greater than 2. B represents a hydrolyzed or partially hydrolyzed compound of the formula (II):

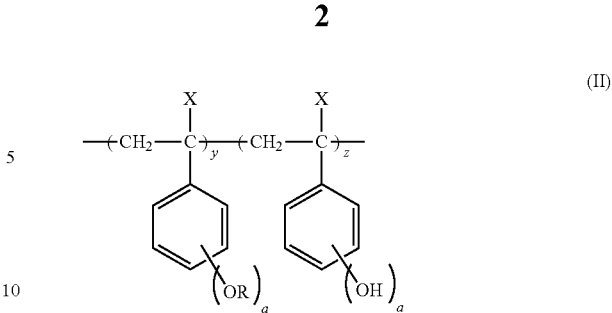

wherein, X represents H or $CH_3$; R represents H, alkyl or is selected from one of the group including acetoxyl, t-butyl, t-butyldimethyl silyl, acid labile groups and acid stable groups; "a" is an integer from 1 to 5; y and z are molar ratio and are the numbers satisfying $y+z=1$, $0<y \leq 1$ and $0 \leq z<1$.

The present invention also provides an organic thin film transistor comprising a gate, a source, a drain, an organic semiconductor layer connecting with the source and the drain, and a dielectric layer. The foregoing dielectric layer isolates the gate from the organic semiconductor layer and the source from the drain. The material of the dielectric layer is the foregoing mononuclear star-branched polymer dielectric material.

In the present invention, the polymer film formed using mononuclear star-branched polymer dielectric material is more effective in suppressing current leakage than the conventional linear polymer material (such as the linear PVP). Therefore, when the polymer film is used as a gate insulating material, current leakage is effectively suppressed and the performance of the device is improved.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE PREFERRED EMBODIMENTS

Figure 1:
FIG. 1 is a structure of conventional linear polymer material.

Reference will now be made in detail to the present preferred embodiments of the invention, examples of which are illustrated in the accompanying drawings. Wherever possible, the same reference numbers are used in the drawings and the description to refer to the same or like parts.

The mononuclear star-branched polymer dielectric material of the present invention can be applied to form the dielectric layer of an organic thin film transistor (OTFT). The mononuclear star-branched polymer dielectric material has a repeated unit of the formula (I):

$$A\text{-}B_n \quad (I)$$

wherein, A represents a multifunctional center having a functionality and a functional group with "n" arms; n is an integer greater than 2. B represents a hydrolyzed or partially hydrolyzed compound of the formula (II):

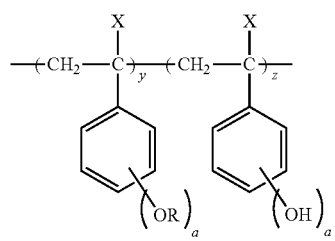

(II)

wherein, X represents H or $CH_3$; R represents H, alkyl or is selected from one of the group including acetoxyl, t-butyl, t-butyldimethyl silyl, acid labile groups and acid stable groups; "a" is an integer from 1 to 5; y and z are molar ratio and are the numbers satisfying $y+z=1$, $0<y\leq 1$ and $0\leq z<1$. Moreover, the n in formula (I) and the n that represents the number of arms in A are identical.

The foregoing mononuclear star-branched polymer dielectric material has a molecular weight smaller than 200,000, and preferably smaller than 100,000.

The value of n for the mononuclear star-branched polymer dielectric material is between 3~10, for example, a mononuclear 3-arm or 6-arm star-branched polymer dielectric material.

The foregoing mononuclear star-branched polymer dielectric material further includes cross-linking agent. The cross-linking agent may include at least two functional reactive groups such as hydroxymethyl group, alkoxymethyl group, epoxy group and vinyl ether group bonded to an aromatic ring, for example, methylol melamine resins, resole resins, epoxidized novolac resins or urea resins. Other examples include amino resins with at least two alkoxymethyl groups, for example, alkoxymethylated melamine resins, alkoxymethylated glycolurils and alkoxymethylated benzoguanamines. For example, if the mononuclear star-branched polymer dielectric material is mononuclear star-branched polyvinylphenol (PVP), the cross-linking agent that can be used includes poly(melamine-co-formaldehyde) (PMF).

Figure 2:
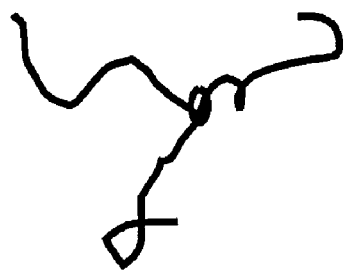
FIG. 2 is a structure of a mononuclear 3-arm star-branched polymer dielectric material according to the present invention.
Figure 3:
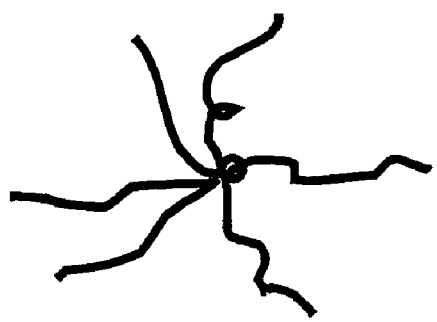
FIG. 3 is a structure of a mononuclear 6-arm star-branched polymer dielectric material according to the present invention.

Because the structure of mononuclear star-branched polymer dielectric material of the present invention such as the mononuclear 3-arm (shown in FIG. 2) and the mononuclear 6-arm (shown in FIG. 3) permits more compact stacking of molecules than the conventional linear polymer dielectric material (shown in FIG. 1), current leakage can be suppressed, and therefore it is advantageous to be used as a gate insulating layer material.

Furthermore, the mononuclear star-branched polymer dielectric material of the present invention may utilize an atom transfer radical polymerization (ATRP) reaction mechanism to prepare polymerized units by catalyzing the initiator with multiple active sites through a metal atom, preferably Cu, in a low oxidation state. Afterwards, the protective functional groups are hydrolyzed or partially hydrolyzed to form the required mononuclear star-branched polymer dielectric material.

In the following, an embodiment of the present invention is described. However, the embodiment is not intended to limit the applications and scope of the present invention.

First Embodiment

When the mononuclear star-branched polymer dielectric material of the present invention is polyvinylphenol (PVP) with n=3, the method of synthesis is as follows:

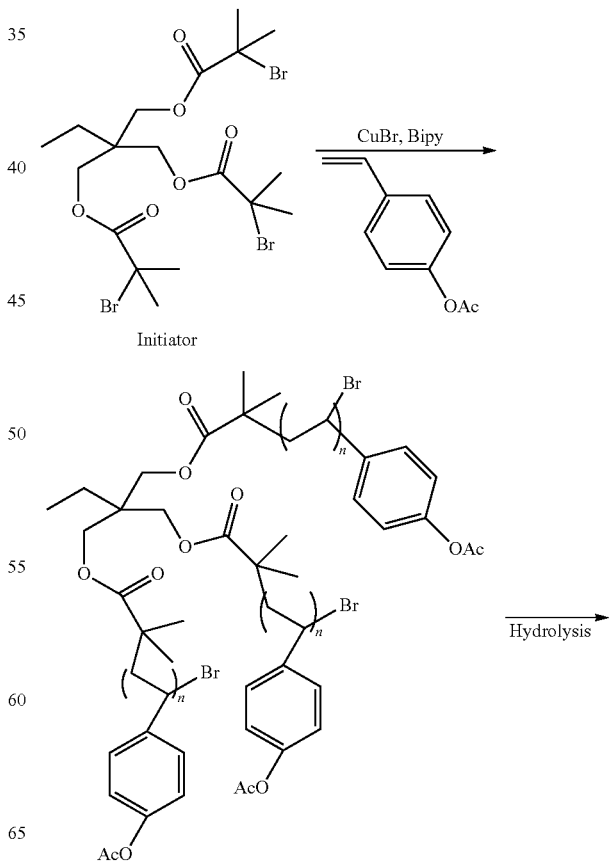

-continued

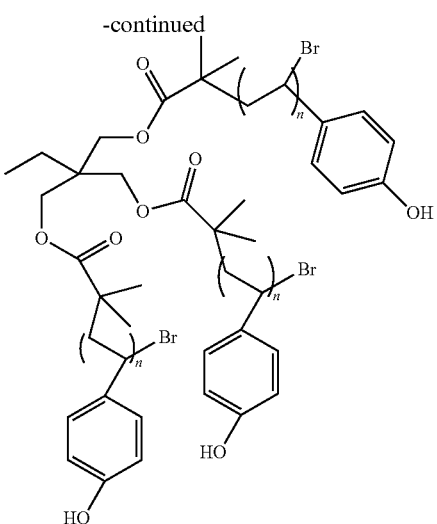

The steps for synthesizing the above chemical structure includes using atomic transfer radical polymerization (ATRP) reaction mechanism to prepare polymerized units by catalyzing 4-acetoxystyrene and 3-arm initiator (represented by "3-arm-I") with multiple active sites through a contact medium CuBr. Afterwards, the protective functional groups are hydrolyzed.

Thus, the foregoing simple synthesis can be employed to synthesis the mononuclear 3-arm star-branched polyvinylphenol (represented by "3-arm PVP") according to the first embodiment of the present invention. Accordingly, with n=3, the A in the formula (I) has the following structure shown in formula (III):

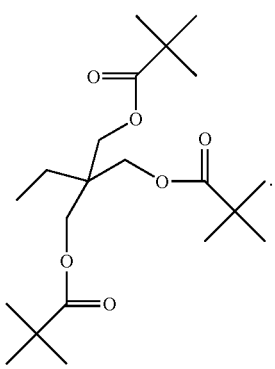

(III)

In addition, the cross-linking agent such as PMF can be added during the process of fabricating the dielectric layer to provide cross-linking in the mononuclear star-branched polymer dielectric material.

In the following, the 3-arm PVP and the mononuclear 6-arm star-branched polyvinylphenol (represented by "6-arm PVP") are used as actual examples showing the process of preparing the polymer dielectric material of the present invention.

Example 1

Preparation of 3-Arm PVP

Preparing 3-arm-I

In an atmosphere of nitrogen ($N_2$), 2.7 g (20 mmol) of 2-ethyl-2-(hydroxymethyl)-1,3-propanediol is dissolved in 40 ml of anhydrous pyridine. Under vigorous stirring condition, 13 mL (ca. 120 mmol) of 2-bromoiso butyryl bromide is gradually dripped (drop-by-drop) over-night at room temperature. Next, two spoons of NaCl are added at room temperature. Next, at 60° C., a high vacuum is created to remove the pyridine and the resulting product is dissolved in chloroform. Next, a water extraction method is used to remove any residual pyridinium salt. After that, the solvent is evaporated to obtain the product and re-crystallization is performed in chloroform to purify the product. After cleaning the product with cold ethyl ether, it is dried in a vacuum oven at 60° C. overnight to obtain the initiator with structural formula A. (Yield: 20%, white crystals). $^1$H-NMR (CDCl$_3$): δ=0.92 (t, 3H), 1.55 (q, 2H), 1.90 (s, 18H), 4.15 (s, 6H)

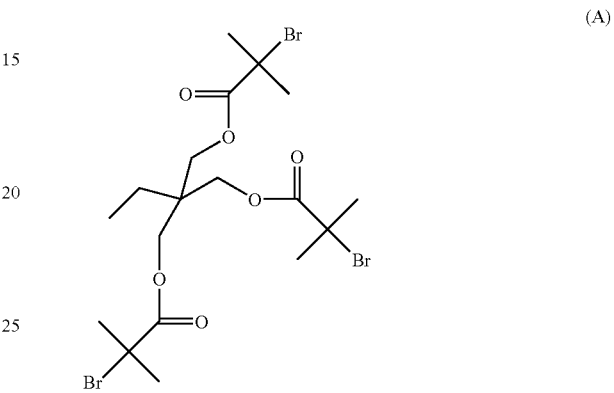

(A)

Using ATRP to Synthesize 3-Arm poly(vinyl phenyl acetate))

CuBr (0.037 g), 2,2'-bipyridine (0.082 g), 3-arm-I (0.051 g) and 4-acetoxystyrene (3 g) are added to a Schlenk flask, then toluene (1.5 g) and a magnetic stirrer are added to the Schlenlc flask. Thereafter, a three-stage freeze-pump-thaw cycle is performed to remove gases, and then the Schlenlk flash is immersed in an oil bath at 90° C. for about 24 hours. Afterwards, the reaction mixture is diluted using toluene and filtered through silicon gel pad. The filtrate is concentrated by removing the solvent. The concentrated filtrate is re-dissolved in 30 ml of acetone and precipitated out in 300 ml of pentane. After filtering and drying in a high vacuum, a product (Mn=12210, Mw=13817, polydispersity index (PDI)= 1.08) (the yield: 47%, white powder) is obtained. To obtain a higher molecular weight polymer, the reaction step may be repeated and low molecular weight polymer may be used as the initiator. The foregoing mixture is formed after heating to 90° C. for 24 hours. The mixture is then re-dissolved in 30 ml of acetone and refined by precipitation from 300 ml of pentane. After filtering and drying in a high vacuum, the 3-arm poly(vinyl phenyl acetate) (Mn=21185, Mw=24729, PDI=1.17) is obtained.

Synthesizing 3-Arm PVP

The 3-arm poly(vinyl phenyl acetate) (0.94 g) and hydrazine (0.56 g) are dissolved in dioxane and stirred for 6 hours to remove the acetoxyl groups. Next, the reaction mixture is precipitated in H$_2$O. Next, it is filtered and dried to obtain the final product 3-arm PVP (Mn=22485, Mw=25608, PDI=1.14). (Yield: 70%, white powder).

Example 2

Preparation of 6-Arm PVP

Preparing 6-arm-I

A process similar to the foregoing method of preparing 3-arm-I is used. First, 3.814 g (15 mmol) of dipentaerythritol and 24 ml (180 mmol) of 2-bromoisobutyryl bromide are reacted. The final product is the initiator shown with structural formula (B). (A solid light yellowish powder, yield is about 47%).

$^1$H-NMR (CDCl$_3$): δ=1.93 (s, (CH$_3$)$_2$CBrC((=O)O), 3.59 (s, CH$_2$OCH$_2$), and 4.29 (s, (CH$_3$)$_2$CBrC ((=O)OCH$_2$).

(B)

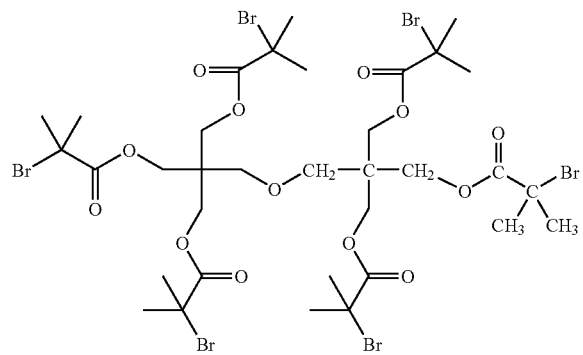

Using ATRP to Synthesize 6-Arm poly(vinyl phenyl acetate))

CuBr (0.037 g), 2,2'-bipyridine (0.082 g), the 6-arm-I (0.094 g) and 4-acetoxystyrene (2.67 g) are added to a Schlenk flask, then toluene (1.5 g) and a magnetic stirrer are added to the Schlenk flask. Thereafter, a three-stage freeze-pump-thaw cycle is performed to remove gases, and then the Schlenk flash is immersed in an oil bath at 90° C. for about 20 hours. Afterwards, the reaction mixture is diluted using toluene and filtered through silicon plastic tube column. The filtrate is concentrated by removing the solvent. The concentrated filtrate is re-dissolved in 30 ml of acetone and precipitated out in 300 ml of pentane. After filtering and drying in a high vacuum, a product (Mn=23634, Mw=27917, PDI=1.18) (yield: 75%, white powder) is obtained.

Synthesizing 6-Arm PVP

The 6-arm poly(vinyl phenyl acetate) (2 g) and hydrazine (1.2 g) are dissolved in dioxane and stirred 6 hours to remove the acetoxyl groups. Next, the reaction mixture is precipitated in H$_2$O. Next, it is filtered and dried to obtain the product 6-arm PVP (Mn=21098, Mw=24751, PDI=1.17). (Yield: 80%, white powder).

Synthesizing Partially Hydrolyzed 6-Arm PVP

The 6-arm poly(vinyl phenyl acetate) (0.5 g) and hydrazine (1.2 g) are dissolved in dioxane and stirred for 1 hour to hydrolyze a portion of the acetoxyl groups. Next, the reaction mixture is precipitated in H$_2$O. After that, it is filtered and dried to obtain partially hydrolyzed 6-arm PVP (Mn=25745, Mw=33302, PDI=1.29). (Yield: 80%, white powder). $^1$H-NMR (MeOD): δ=1.2~2.0 (m, —CHCH$_2$—), 2.18 (br.s, —OC(CH$_3$)$_3$), and 6.20~7.00 (m, —C$_6$H$_4$O—).

In the product obtained in the second example, A has a structural formula (IV) with n=6:

(IV)

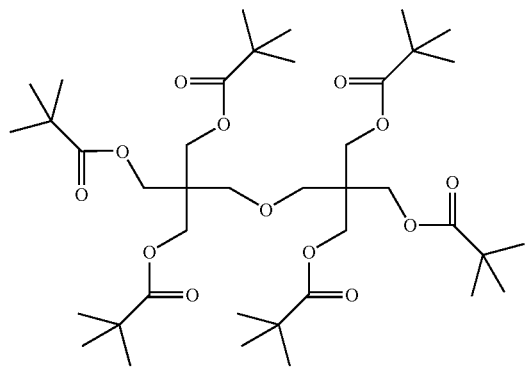

To verify the merits of the mononuclear star-branched polymer dielectric material of the present invention over the conventional linear polymer dielectric material, the final products of example 1 and example 2 are processed into thin films and the properties of the films are tested.

The preparation of the thin film includes mixing several PVP derivatives (including the conventional linear PVP and the 3-arm and 6-arm PVP of the foregoing first and second examples) to form a 10 wt % solution (using propylene glycol monomethyl ether acetate (PGMEA) as solvent). Next, a spin coating (1000 rpm, 30 s) method is used to coat the solution on a substrate. The substrate is a platinum-containing (60 nm)-silicon (Si) substrate. In addition, the foregoing PVP derivative and a cross-linking agent such as poly(melamine-co-formaldehyde (PMF) can be mixed to form a solution and then spin coat the solution on the substrate to produce a PVP film with cross-linkages.

Next, the film is baked in an evacuated oven at a high temperature for about an hour. Next, a gold electrode is plated on the film. Next, electrical measurements of this metal-insulator-metal (MIM) sandwich structure device are performed. The thickness of the thin film is measured using a scanning electron microscope (SEM).

Figure 4:
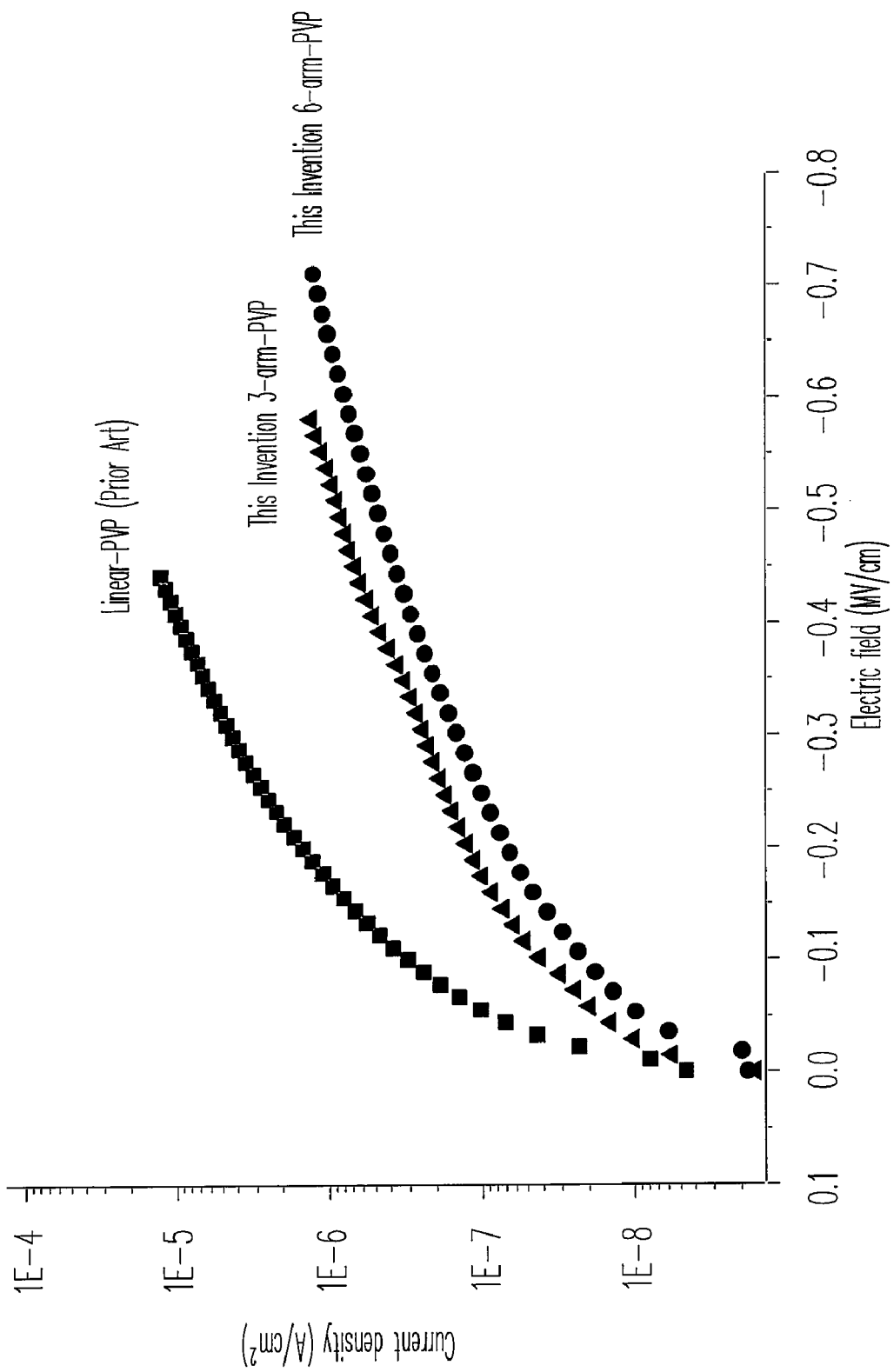
FIG. 4 is a graph showing curves illustrating the relationships between electric field and current density for the conventional linear PVP as well as the 3-arm PVP and the 6-arm PVP according to the present invention.
Figure 5:
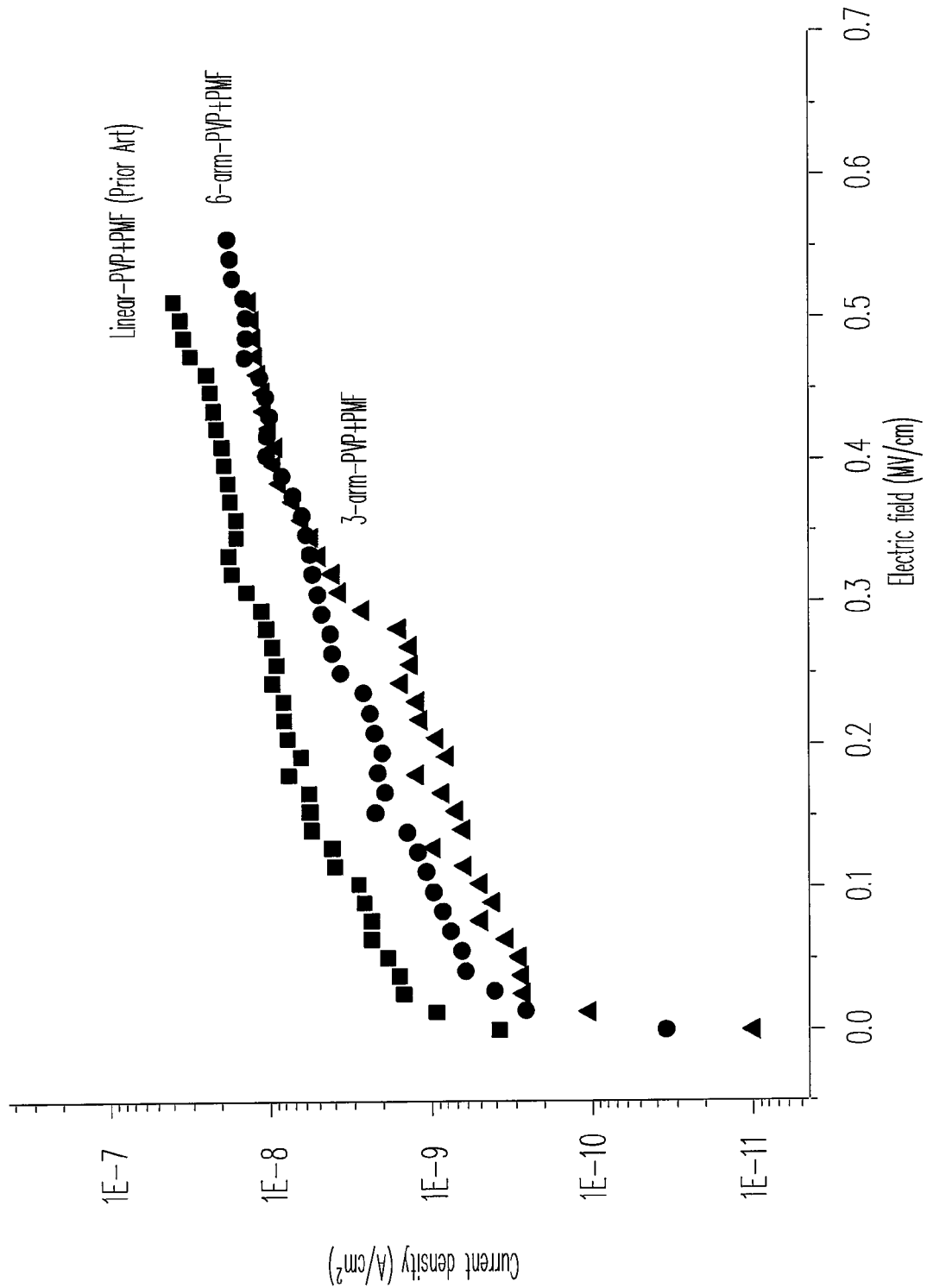
FIG. 5 is a graph showing curves illustrating the relationships between electric field and current density for the conventional linear PVP plus cross-linking agent (PMF) as well as the 3-arm PVP plus cross-linking agent (PMF) and the 6-arm PVP plus cross-linking agent (PMF) according to the present invention.
Figure 6:
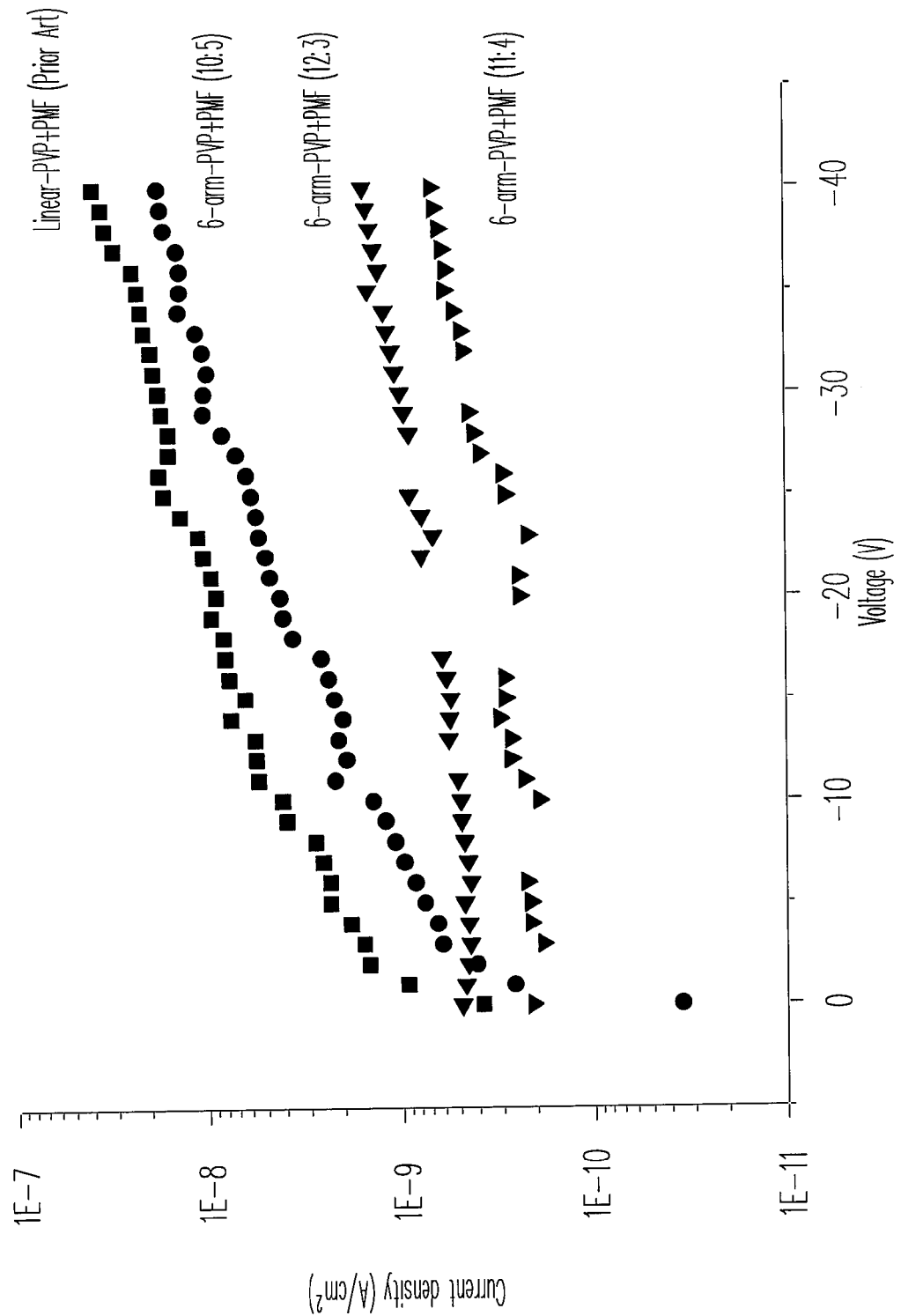
FIG. 6 is a graph showing curves illustrating the relationships between electric field and current density with different ratios between the 6-arm PVP of the present invention and the cross-linking agent (PMF).

The electrical measurements can be carried out in air using an HP 4156 machine. FIGS. 4 through 6 are diagrams showing curves illustrating a few of the electric field versus current density relationships.

FIG. 4 is a graph showing curves illustrating the relationships between electric field and current density for conventional linear PVP as well as the 3-arm PVP 20 and the 6-arm PVP according to the present invention. As shown in FIG. 4, the 3-arm PVP and the 6-arm PVP have a current density significantly lower than that of the conventional linear PVP under the same spin coating conditions.

FIG. 5 is a graph showing curves illustrating the relationships between electric field and current density for the conventional linear PVP plus cross-linking agent (PMF) as well as the 3-arm PVP plus cross-linking agent (PMF) and the 6-arm PVP plus cross-linking agent (PMF) according to the present invention. As shown in FIG. 5, the cross-linked 3-arm PVP and the cross-linked 6-arm PVP have a current density lower than that of the conventional cross-linked linear PVP.

FIG. 6 is a graph showing curves illustrating the relationships between electric field and current density with different ratios between the 6-arm PVP of the present invention and the cross-linking agent (PMF). As shown in FIG. 6, regardless of the ratio between the 6-arm PVP and the cross-linking agent (PMF), the result is always better compared to the conventional linear PVP.

Figure 7:
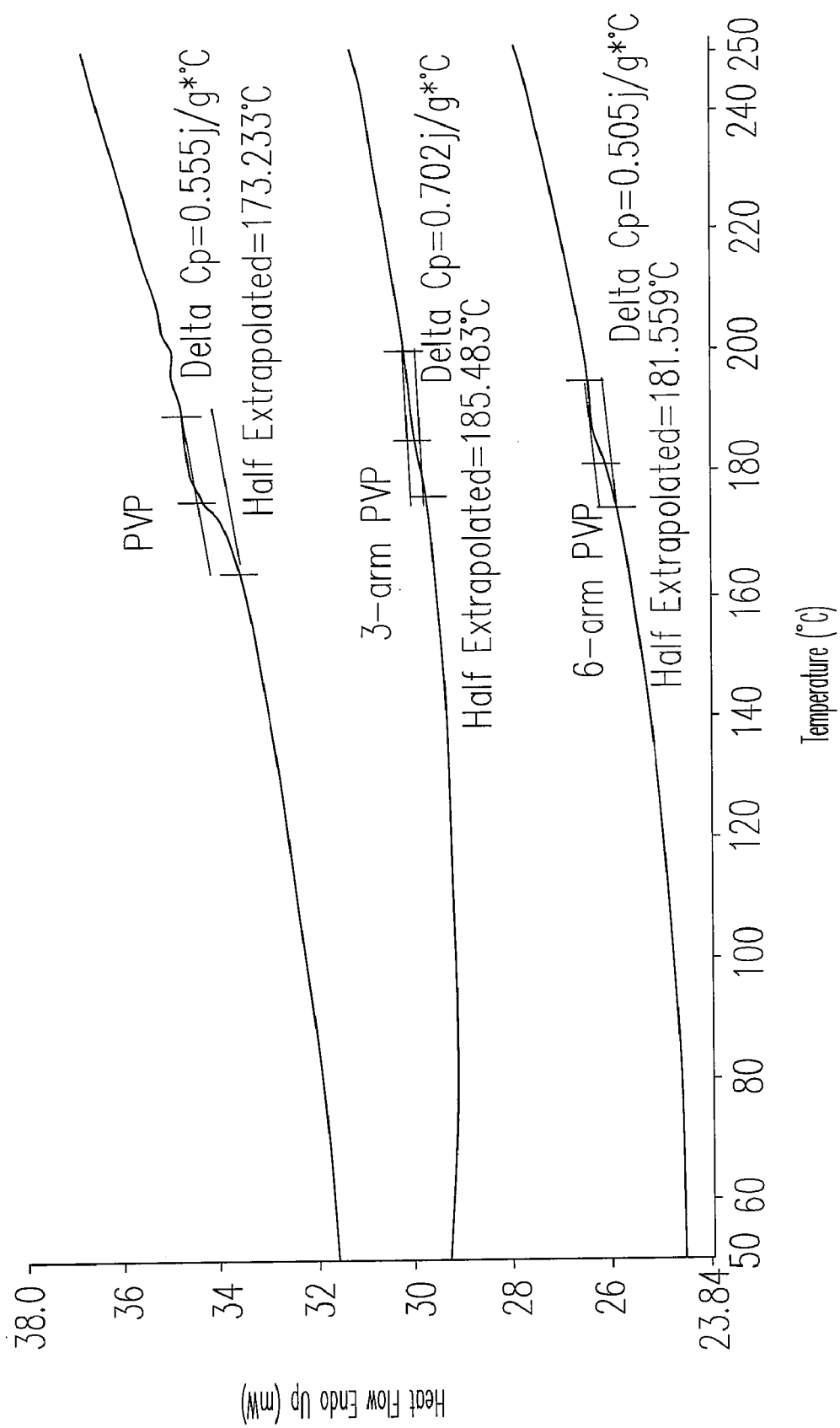
FIG. 7 is a graph showing curves illustrating the relationships between temperature and heat absorption for the conventional linear PVP as well as the 3-arm PVP and the 6-arm PVP according to the present invention.

Besides improving the electrical properties, the mononuclear star-branched polymer dielectric material of the present invention also has better thermal properties than the conventional linear polymer dielectric material. FIG. 7 is a graph showing curves illustrating the relationships between temperature and heat absorption for the conventional linear PVP as well as the 3-arm PVP and the 6-arm PVP according to the present invention. As shown in FIG. 7, the 3-arm PVP and the 6-arm PVP of the present invention have glass transition temperature of about 185° C. and 182° C. respectively. Compared with the glass transition temperature of about 173° C. for the conventional linear PVP, the mononuclear star-branched polymer dielectric material of the present invention is able to withstand a higher temperature.

Furthermore, to verify the applicability of the mononuclear star-branched polymer dielectric material of the present invention in the existing organic thin film transistor, the surface energies of the organic insulating films of FIGS. 4 through 6 can be measured using the contact angle measuring method (using FACE contact-angle meter, Kyowa Kaimen-kagaku Co.). Furthermore, the foregoing contact angle measuring method uses distilled water and di-iodomethane as the probe liquid. The results of the measurements are shown in Table 1 below.

TABLE 1

| | PVP Derivative | Surface Energy (mJ/m$^2$) |
|---|---|---|
| FIG. 4 | Linear-PVP (Prior Art) | 44.30 |
| | 3-arm PVP | 45.54 |
| | 6-arm PVP | 46.65 |
| FIG. 5 | Linear-PVP + PMF(10:5) (Prior Art) | 46.64 |
| | 3-arm PVP + PMF(10:5) | 48.75 |
| | 6-arm PVP + PMF(10:5) | 47.93 |
| FIG. 6 | Linear-PVP + PMF (10:5) | 46.64 |
| | 6-arm PVP + PMF (10:5) | 47.93 |
| | 6-arm PVP + PMF (11:4) | 48.18 |
| | 6-arm PVP + PMF (12:3) | 47.18 |

As can be seem from Table 1, the surface energies of the mononuclear star-branched polymer dielectric materials of the present invention are very close to the surface energies of the conventional materials. Therefore, the material of the present invention can be used in the existing organic thin film transistor to replace the conventional PVP material.

In the following, another embodiment of the present invention is described to illustrate the effect of using the material of the present invention in an organic thin film transistor.

Second Embodiment

Figure 8:
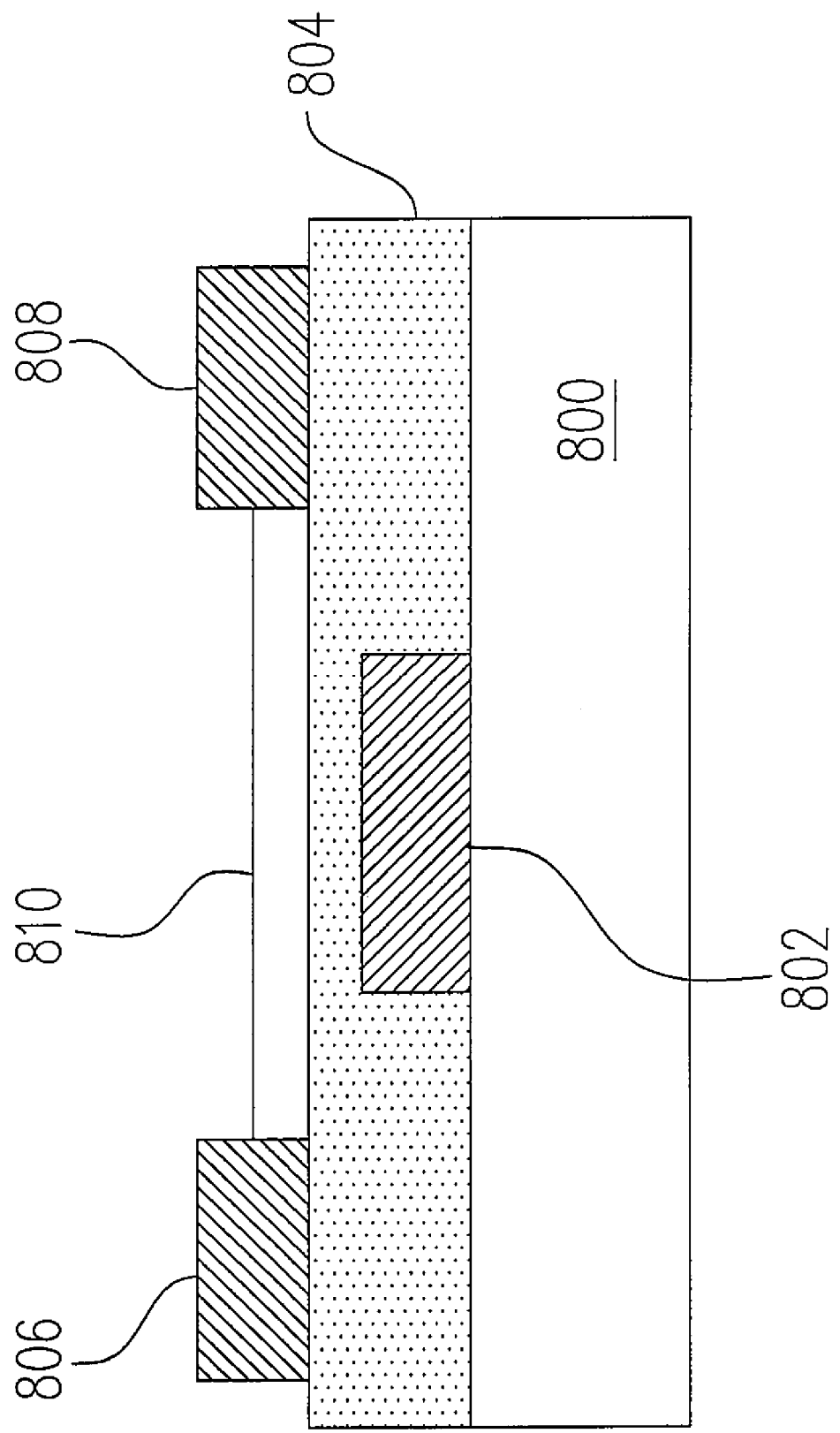
FIG. 8 is a schematic cross-sectional view of an organic thin film transistor according to another embodiment of the present invention.

FIG. 8 is a schematic cross-sectional view of an organic thin film transistor according to another embodiment of the present invention.

As shown in FIG. 8, the organic thin film transistor in the second embodiment mainly includes a substrate 800, a gate 802, a mononuclear star-branched polymer dielectric material layer 804, a source 806, a drain 808 and an organic semiconductor layer 810. The organic semiconductor layer 801 is connected to the source 806 and the drain 808. The mononuclear star-branched polymer dielectric material layer is used to isolate the gate 802 from the organic semiconductor layer 810 and the source 806 from the drain 808. Furthermore, the dielectric layer 804 may further include a cross-linking agent, wherein the ratio between the cross-linking agent and the mononuclear star-branched polymer dielectric material is about 5:10. In addition, the material of the organic semiconductor layer 810 can be pentacene. Therefore, the organic thin film transistor in the second embodiment can be a pentacene-based organic thin film transistor.

Table 2 below lists the data when the 3-arm PVP in the first example, the market sold linear PVP, the cross-linked 3-arm PVP and the market sold cross-linked linear PVP are used to form the dielectric layer of the organic thin film transistor in the present embodiment, 70 nm thick pentacene is used to form the organic semiconductor layer 810, and a voltage $V_{DS}$ of about −40V is applied.

TABLE 2

| Insulating layer (PVP) | Carrier Mobility (cm$^2$/Vs) | on/off | $V_t$(V) |
|---|---|---|---|
| 3-arm PVP | 0.019 | >10$^4$ | −15.86 |
| Market sold PVP: Aldrich's poly(4-vinylphenol) (Mw~20000) | 0.013 | >10$^4$ | −15.89 |

TABLE 2-continued

| Insulating layer (PVP) | Carrier Mobility (cm$^2$/Vs) | on/off | $V_t$(V) |
|---|---|---|---|
| 3-arm PVP + PMF(Cross-linking agent) | 0.020 | >10$^6$ | −19.19 |
| Market sold linear PVP + PMF(Cross-linking agent) | 0.006 | >10$^6$ | −19.46 |

Although the embodiment in FIG. 8 only shows only a bottom-gate top contact organic thin film transistor, the mononuclear star-branched polymer dielectric material of the present invention can be applied to other types of organic thin film transistors such as a bottom-gate bottom contact organic thin film transistor or a top-gate organic thin film transistor.

In summary, the mononuclear star-branched polymer dielectric material of the present invention is more effective than the conventional linear polymer dielectric material in suppressing current leakage. When the material is used as the gate insulating layer material of an organic thin film transistor, the performance of the device is also boosted. In addition, the mononuclear star-branched polymer dielectric material of the present invention also boosts thermal stability.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims and their equivalents.

What is claimed is:

1. An organic thin film transistor, comprising:
a gate, a source, a drain;
an organic semiconductor layer, connected to the source and the drain; and
a dielectric layer, isolating the gate from the organic semiconductor layer and the source from the drain, wherein the dielectric layer comprises a mononuclear star-branched polymer dielectric material having a repeated unit of the formula (I):

wherein, A in formula (I) has a following structure shown in formula (III);

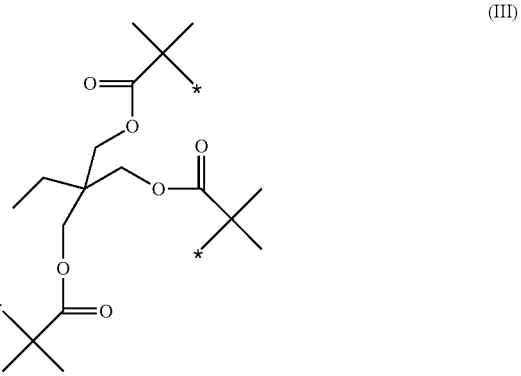

in the formula (III), each of position marked by a star is attached to B of the formula (I);
B represents a partially hydrolyzed compound of the formula (II):

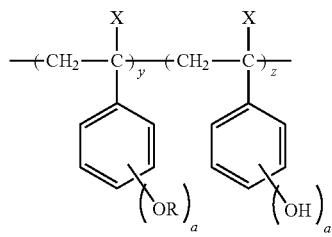 (II)

wherein, X represents H or $CH_3$;

R represents alkyl, acetyl, t-butyl, or t-butyldimethyl silyl;

"a" is an integer from 1 to 5;

y and z are molar ratio and are the numbers satisfying y+z=1, 0<y<1 and 0<z<1.

2. The organic thin film transistor of claim 1, wherein the X in formula (II) represents H.

3. The organic thin film transistor of claim 1, wherein a number-average molecular weight of the mononuclear star-branched polymer dielectric material is smaller than 200,000.

4. The organic thin film transistor of claim 1, wherein the dielectric layer further comprises a cross-linking agent.

5. The organic thin film transistor of claim 1, wherein the semiconductor layer comprises pentacene.

\* \* \* \* \*